(12) United States Patent
Lee et al.

(10) Patent No.: US 8,385,490 B2
(45) Date of Patent: Feb. 26, 2013

(54) DISCRETE TIME FILTER AND RECEIVER INCLUDING THE SAME

(75) Inventors: Jung Ho Lee, Gunpo-si (KR); Myoung Oh Ki, Incheon (KR); Sang Yoon Jeon, Seoul (KR); Heung Bae Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 307 days.

(21) Appl. No.: 12/795,208

(22) Filed: Jun. 7, 2010

(65) Prior Publication Data
US 2010/0316174 A1 Dec. 16, 2010

(30) Foreign Application Priority Data
Jun. 12, 2009 (KR) .................. 10-2009-0052447

(51) Int. Cl.
*H04B 1/10* (2006.01)
(52) U.S. Cl. ........ 375/350; 375/285; 327/552; 327/553; 327/558; 708/313
(58) Field of Classification Search .............. 375/350, 375/285, 316, 375; 327/551–559; 708/300, 708/313, 290
See application file for complete search history.

(56) References Cited

U.S. PATENT DOCUMENTS

| | | | |
|---|---|---|---|
| 6,300,823 B1* | 10/2001 | Zhou et al. .................. 327/551 |
| 6,791,399 B2* | 9/2004 | Jaussi et al. ................. 327/553 |
| 6,882,861 B2 | 4/2005 | Panasik et al. |
| 7,057,540 B2* | 6/2006 | Muhammad et al. ......... 341/143 |
| 7,489,263 B1* | 2/2009 | Drakshapalli et al. ........ 341/155 |
| 7,519,349 B2 | 4/2009 | Sridharan |
| 7,539,721 B2* | 5/2009 | Belveze et al. .............. 708/819 |
| 7,602,862 B2* | 10/2009 | May et al. .................... 375/322 |
| 7,994,850 B2* | 8/2011 | Burke .......................... 327/554 |
| 2002/0160732 A1 | 10/2002 | Panasik et al. |
| 2007/0197183 A1 | 8/2007 | Sridharan |
| 2008/0186409 A1 | 8/2008 | Kang et al. |
| 2009/0147884 A1 | 6/2009 | Sridharan |
| 2009/0322418 A1* | 12/2009 | Burke .......................... 327/552 |
| 2010/0248675 A1* | 9/2010 | Hosokawa et al. .......... 455/334 |
| 2010/0310007 A1* | 12/2010 | Lozhkin ....................... 375/296 |

FOREIGN PATENT DOCUMENTS

| | | |
|---|---|---|
| JP | 7-274143 | 10/1995 |
| KR | 10-2008-0095281 | 10/2008 |

* cited by examiner

*Primary Examiner* — Jean B Corrielus
(74) *Attorney, Agent, or Firm* — Onello & Mello, LLP

(57) ABSTRACT

A discrete time filter includes a plurality of sampling cells and a first dummy sampling cell. Each of the sampling cells performs a current mode sampling operation based on current input to an input terminal in response to a corresponding one of a plurality of sampling clock signals and is reset in response to a corresponding one of the plurality of sampling clock signals and a first dummy sampling clocks. The first dummy sampling cell alternately performs with the first sampling cell the current mode sampling operation based on current input to the input terminal in response to the first dummy sampling clock signal and is alternately reset with the first sampling cell in response to the first sampling clock signal.

20 Claims, 9 Drawing Sheets

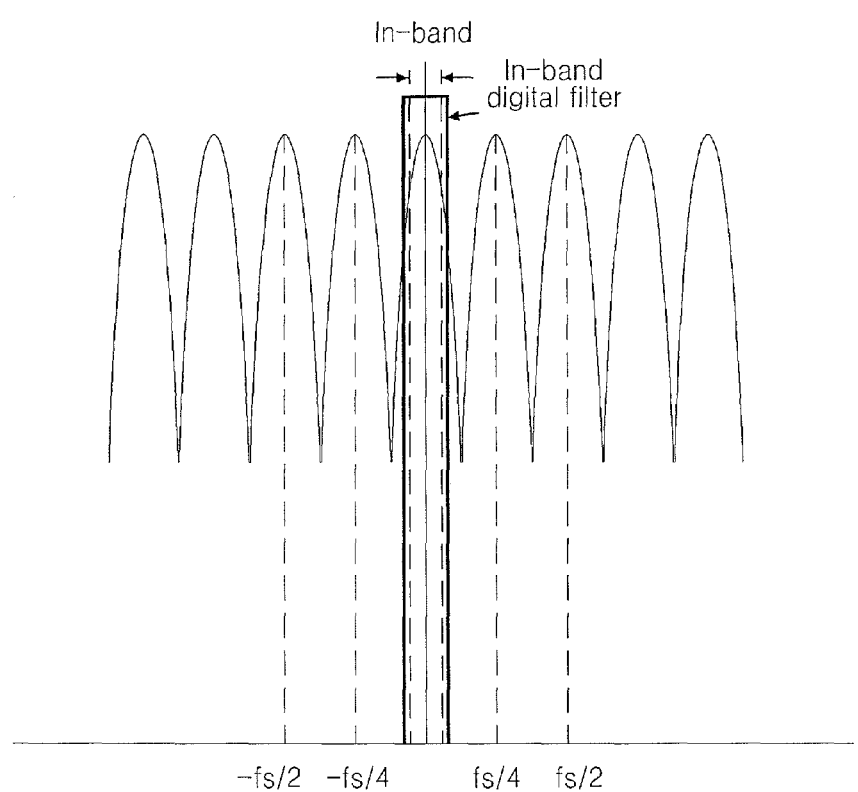

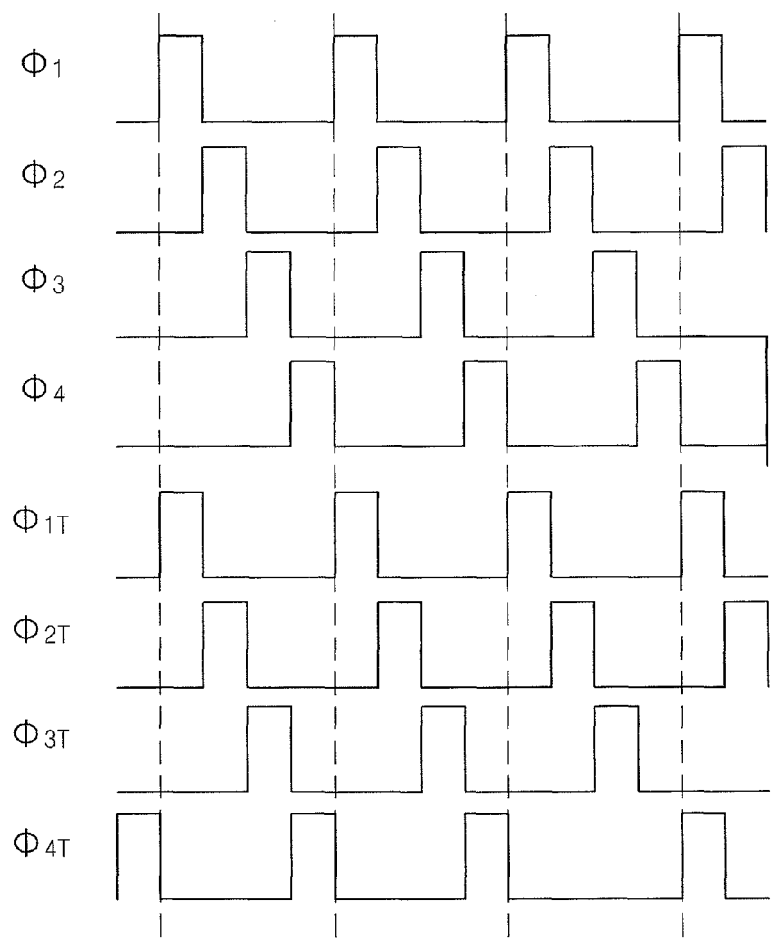

DISCRETE TIME FILTER AND RECEIVER INCLUDING THE SAME

CROSS-REFERENCE TO RELATED APPLICATIONS

This application claims the benefit of Korean Patent Application No. 10-2009-0052447, filed on Jun. 12, 2009, in the Korean Intellectual Property Office, the disclosure of which is incorporated herein in its entirety by reference.

FIELD

The inventive concept relates to a discrete time filter and a receiver including the discrete time filter, and more particularly, to a digital filter performing current mode sampling, and a receiver for sampling a radio frequency (RF) signal and/or a baseband signal by using the discrete time filter.

BACKGROUND

Recently, due to the refinement of semiconductor manufacturing processes, as the gate length of a transistor decreases, the overall chip size and power consumption a semiconductor chip decrease and a speed of operation increases. Although these changes are merits for a digital circuit, this is not the case for an analog circuit, because such changes result in a decrease in the impedance of a power voltage and an output impedance of a transistor. Thus, sensitivity of a circuit to external noise increases, a dynamic range decreases, and a limitation in linearity increases.

Due to the above, available portions of many circuits designed in an analog domain are transferred to a digital domain to overcome such limitations in designing an analog circuit. Also, a great deal of research and development has improved the merits of a digital circuit, for example, insensitivity to noise, reductions in time and costs for design/development, and reductions in size and consumption power.

A low noise amplifier (LNA), a radio frequency (RF) mixer, a phase locked loop (PLL), a channel select filter, an intermediate frequency (IF) mixer, an automatic gain controller, which are included in a super-heterodyne analog receiver that is one sort of an analog RF receiver, are implemented in an analog domain.

As the design process pushes analog devices to become smaller and more refined, the analog receiver consequently has problems, such as an increase in design limitations and a deterioration in the operational characteristics of each block, as described above. To maintain the overall performance of an analog receiver, power consumption is increased or an additional filter or a gain block is necessary. Also, most analog receivers need additional correction circuits to overcome some of these limitations.

SUMMARY

The inventive concept provides a discrete time filter which may replace an analog circuit and have merits such as performing a stable operation in a high speed operation, insensitivity to noise, reduction in time and costs for design/development, and reduction in size and power consumption, and a receiver which may perform a sampling operation by using the discrete time filter.

According to an aspect of the inventive concept, there is provided a discrete time filter including a plurality of sampling cells responsive to a plurality of sampling clock signals and a first dummy sampling cell. A first sampling cell is arranged to perform a current mode sampling operation based on current input to an input terminal and in response to a corresponding first sampling clock signal, and to be reset in response to the first sampling clock signal and a first dummy sampling clock signal. And the first dummy sampling cell is arranged to alternately perform the current mode sampling operation based on current input to the input terminal with the first sampling cell and in response to the first dummy sampling clock signal, and to be reset alternately with the first sampling cell in response to the first sampling clock signal.

The discrete time filter may be further arranged to perform a frequency decimation operation and an interpolation operation corresponding to a decimation factor of the frequency decimation operation.

The first sampling cell may be reset by alternately responding to the first sampling clock signal and the first dummy sampling clock signal.

The discrete time filter may further include a capacitor connected between the input terminal and a ground voltage line.

The discrete time filter may further include an automatic gain control block connected to an output terminal of the discrete time filter and arranged to control a gain of the discrete time filter.

Each of the plurality of sampling cells may include a pair of first switches, a capacitor, and at least one of the first sub-sampling cell including a first sub-sampling cell switch. The pair of first switches can be serially connected between the input terminal and the output terminal of the discrete time filter, each of the first switches can be arranged to be switched in response to a corresponding one of the plurality of sampling clock signals and an output clock signal, respectively. The capacitor may be connected between a common node of the pair of first switches and a ground voltage line. The first sub-sampling cell switch can be connected between the common node of the pair of first switches and the ground voltage line and be arranged to be switched in response to a corresponding one of the plurality of sampling clock signals.

The at least one of the first sub-sampling cell may further include a plurality of pairs including a switch and a capacitor, each pair being serially connected between the common node of the pair of first switches and the ground voltage line. The switch may be switched in response to a corresponding one of a plurality of gain control signals.

The first dummy sampling cell may include a pair of second switches, a capacitor, and at least one of the second sub-sampling cell comprising a second sub-sampling cell switch. The pair of second switches may be serially connected between the input terminal and the output terminal, each of the second switches can be arranged to be switched in response to the first sampling clock signal and the output clock signal, respectively. The capacitor may be connected between a common node of the pair of second switches and the ground voltage line. The second sub-sampling cell switch can be connected between the common node of the pair of second switches and the ground voltage line and be arranged to be alternately switched with the first sub-sampling cell switch in response to the first sampling clock signal.

The discrete time filter may further include a second dummy sampling cell arranged to alternately perform the current mode sampling operation based on the current input to the input terminal with a second sampling cell and in response to a second dummy sampling clock signal, and to be reset alternately with the second sampling cell in response to a corresponding second sampling clock signal. The second sampling cell may be arranged to be reset by alternately responding to the second sampling clock signal and the second dummy sampling clock signal.

According to another aspect of the inventive concept, there is provided a receiver including a mixer and the discrete time filter. The mixer may receive a radio frequency (RF) signal, convert a received RF signal to a baseband signal based on a signal output by a delay lock loop, and output a converted signal. The discrete time filter performs a current mode sampling operation to the baseband signal output by the mixer. The discrete time filter includes a plurality of sampling cells responsive to a plurality of sampling clock signals, wherein a first sampling cell is arranged to perform a current mode sampling operation based on current input to an input terminal and in response to a corresponding first sampling clock signal, and to be reset in response to the first sampling clock signal and a first dummy sampling clock signal; and a first dummy sampling cell arranged to alternately perform the current mode sampling operation based on current input to the input terminal with the first sampling cell and in response to the first dummy sampling clock signal, and to be reset alternately with the first sampling cell in response to the first sampling clock signal.

Each of the plurality of sampling cells can include a pair of first switches serially connected between the input terminal and an output terminal of the discrete time filter, a capacitor, and at least one of the first sub-sampling cell including a first sub-sampling cell switch. Each of the first switches can be arranged to be switched in response to a corresponding one of the plurality of sampling clock signals and an output clock signal, respectively. The capacitor can be connected between a common node of the pair of first switches and a ground voltage line. The first sub-sampling cell switch can be connected between the common node of the pair of first switches and the ground voltage line and arranged to be switched in response to a corresponding one of the plurality of sampling clock signals.

The at least one of the first sub-sampling cell can further include a plurality of pairs including a switch and a capacitor, each pair being serially connected between the common node of the pair of first switches and the ground voltage line. The switch can be switched in response to a corresponding one of a plurality of gain control signals.

The first dummy sampling cell can include: a pair of second switches serially connected between the input terminal and the output terminal, a capacitor, and at least one of the second sub-sampling cell comprising a second sub-sampling cell switch. Each of the second switches can be arranged to be switched in response to the first sampling clock and the output clock signal, respectively. The capacitor can be connected between a common node of the pair of second switches and the ground voltage line. And the second sub-sampling cell switch can be connected between the common node of the pair of second switches and the ground voltage line and alternately being switched with the first sub-sampling cell switch in response to the first sampling clock signal.

The discrete time filter can further include: a second dummy sampling cell arranged to alternately perform the current mode sampling operation based on the current input to the input terminal with a second sampling cell and in response to a second dummy sampling clock signal, and to be reset alternately with the second sampling cell in response to a corresponding second sampling clock signal. The second sampling cell can be arranged to be reset by alternately responding to the corresponding second sampling clock signal and the second dummy sampling clock signal.

According to another aspect of the inventive concept, there is provided a receiver including a mixer and at least one discrete time filter. The mixer may include a first discrete time filter arranged to convert a received RF signal to a baseband signal by performing a current mode sampling operation to the received RF signal based on a signal output by a delay lock loop and to output a converted signal. The receiver also includes a second discrete time filter arranged to perform a second current mode sampling operation to the baseband signal output by the mixer. The first and second discrete time filters each include: a plurality of sampling cells responsive to a plurality of sampling clock signals, wherein a first sampling cell is arranged to perform a current mode sampling operation based on current input to an input terminal and in response to a corresponding first sampling clock signal, and to be reset in response to the first sampling clock signal and a first dummy sampling clock signal; and a first dummy sampling cell arranged to alternately perform the current mode sampling operation based on current input to the input terminal with the first sampling cell and in response to the first dummy sampling clock signal, and to be reset alternately with the first sampling cell in response to the first sampling clock signal.

The first and second discrete time filters can be the same discrete time filter.

Each of the plurality of sampling cells can include a pair of first switches serially connected between the input terminal and an output terminal of the discrete time filter, a capacitor, and at least one of the first sub-sampling cell including a first sub-sampling cell switch. Each of the first switches can be arranged to be switched in response to a corresponding one of the plurality of sampling clock signals and an output clock signal, respectively. The capacitor can be connected between a common node of the pair of first switches and a ground voltage line. The first sub-sampling cell switch can be connected between the common node of the pair of first switches and the ground voltage line and arranged to be switched in response to a corresponding one of the plurality of sampling clock signals.

The at least one of the first sub-sampling cell can further include a plurality of pairs including: a switch and a capacitor, each pair being serially connected between the common node of the pair of first switches and the ground voltage line, and wherein the switch can be switched in response to a corresponding one of a plurality of gain control signals.

The first dummy sampling cell can include: a pair of second switches serially connected between the input terminal and the output terminal, a capacitor, and at least one of the second sub-sampling cell comprising a second sub-sampling cell switch. Each of the second switches can be arranged to be switched in response to the first sampling clock and the output clock signal, respectively. The capacitor can be connected between a common node of the pair of second switches and the ground voltage line. And the second sub-sampling cell switch can be connected between the common node of the pair of first switches and the ground voltage line and alternately being switched with the first sub-sampling cell switch in response to the first sampling clock signal.

The discrete time filter further can include: a second dummy sampling cell arranged to alternately perform the current mode sampling operation based on the current input to the input terminal with a second sampling cell and in response to a second dummy sampling clock signal, and to be reset alternately with the second sampling cell in response to a corresponding second sampling clock signal, wherein the second sampling cell is arranged to be reset by alternately responding to the corresponding second sampling clock signal and the second dummy sampling clock signal.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention. In the drawings:

FIG. 4C is a graph showing an exemplary embodiment of a spectrum characteristic of the discrete time filter in consideration of a frequency decimation in the spectrum characteristic of FIG. 4B;

FIG. 5A is a timing diagram for explaining an exemplary embodiment of a process in which a discrete time filter having four (4) sampling cells, according to aspects of the present inventive concept, performs an interpolation operation, and not frequency decimation;

DETAILED DESCRIPTION OF THE EMBODIMENTS

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein.

It will be understood that when an element is referred to as being "on," "connected to" or "coupled to" another element, it can be directly on, connected to, or coupled to the other element or intervening elements may be present. In contrast, when an element is referred to as being "directly on," "directly connected to," or "directly coupled to" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Figure 1:
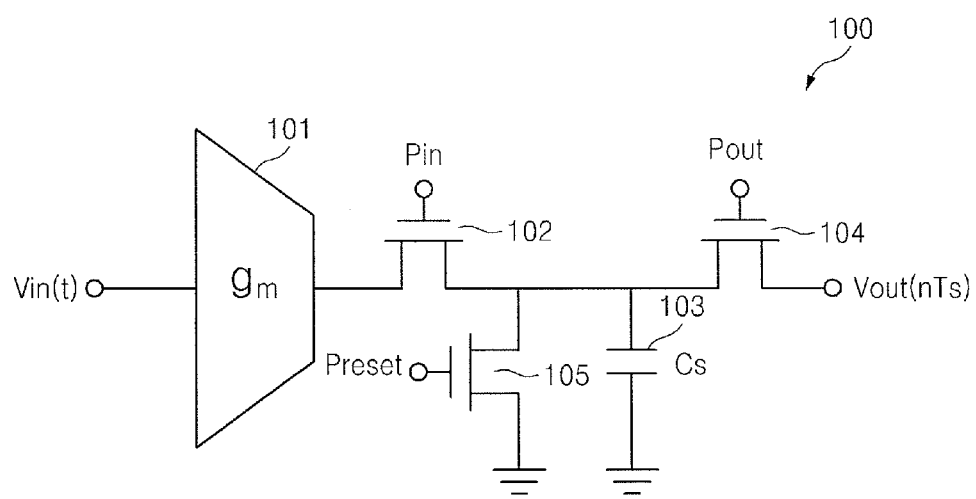
FIG. 1 is a circuit diagram illustrating an exemplary embodiment of a basic structure of a discrete time filter according to aspects of the present inventive concept.

FIG. 1 is a circuit diagram illustrating an exemplary embodiment a basic structure of a discrete time filter according to aspects of the present inventive concept. Referring to FIG. 1, the discrete time filter 100 includes a transconductance circuit 101, a sampling switch 102, a sampling capacitor Cs 103, an output switch 104, and a reset switch 105.

The transconductance circuit 101 generates a current proportional to a difference in the voltage of a differential signal Vin(t) that is input. When the sampling switch 102 is disconnected in response to a sampling clock signal Pin, electric charges are accumulated in the capacitor 103 by the current output from the transconductance circuit 101 so that a signal may be sampled.

Even when the discrete time filter 100 performs high speed sampling, the disconnection time of the sampling switch 102 extends, corresponding to the sampling speed, so that an accurate sampling operation may be performed. That is, as the disconnection time of the sampling switch 102 extends, the sampling characteristic of the discrete time filter 100 may be improved.

When the output switch 104 is disconnected in response to an output signal Pout, a sampled signal Vout(nTs) corresponding to the electric charges accumulated in the capacitor 103 is output. After the sampled signal is output, the electric charges accumulated in the capacitor 103 need to be discharged for the next sampling. When the reset switch 105 is disconnected in response to a reset signal Preset, the electric charges accumulated in the capacitor 103 are discharged to a ground voltage line.

The above method of sampling a signal based on the accumulation of electric charges by the input current is referred to as current mode sampling. The current mode sampling exhibits a superior jitter characteristic and is less affected by flicker noise. The discrete time filter 100 of FIG. 1 is useful in conceptually explaining current mode sampling. The operation of a discrete time filter actually performing the current mode sampling is described below.

Figure 2:
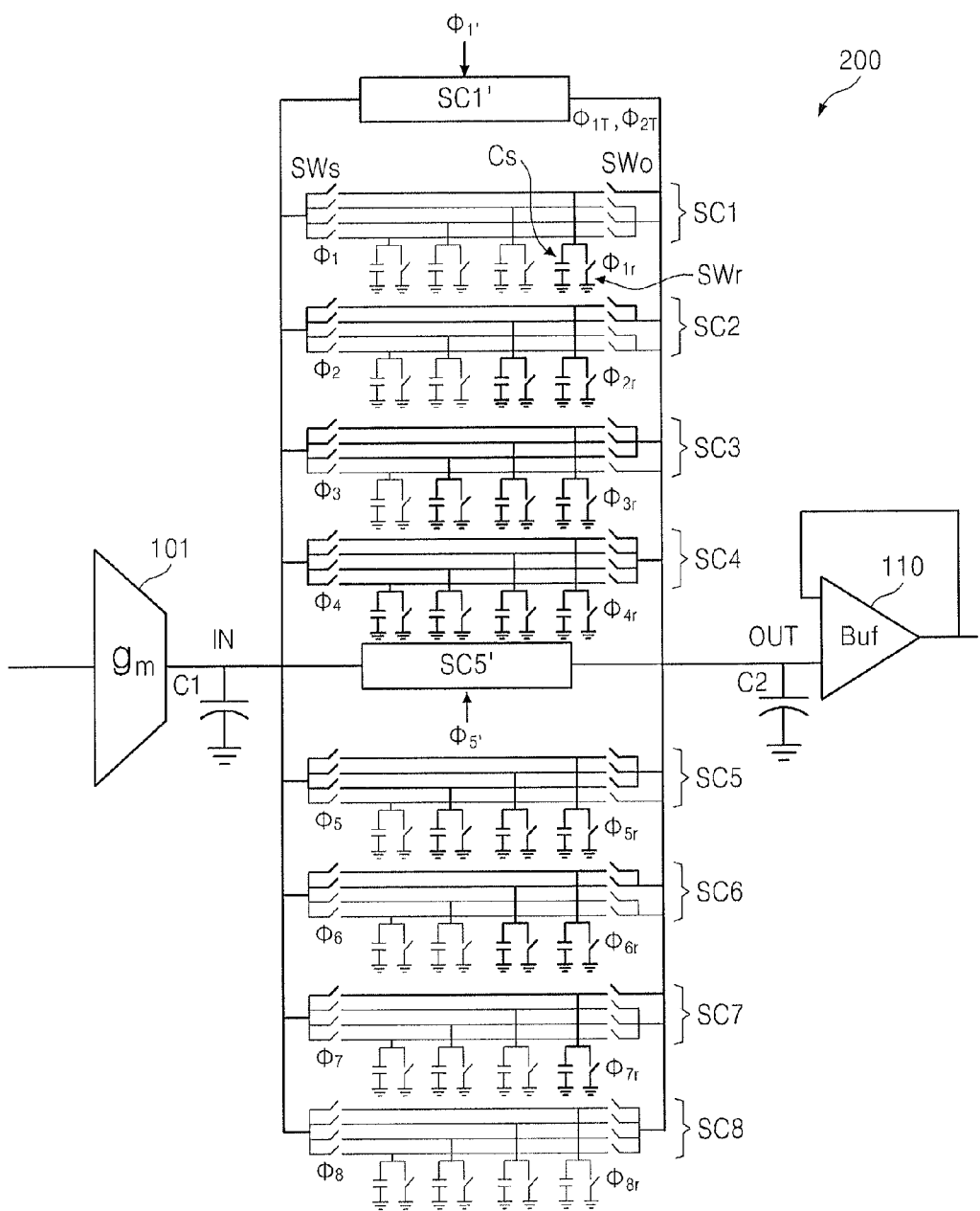
FIG. 2 is a circuit diagram illustrating an exemplary embodiment of a basic structure of a discrete time filter according to aspects an exemplary embodiment of the present inventive concept.
Figure 3:
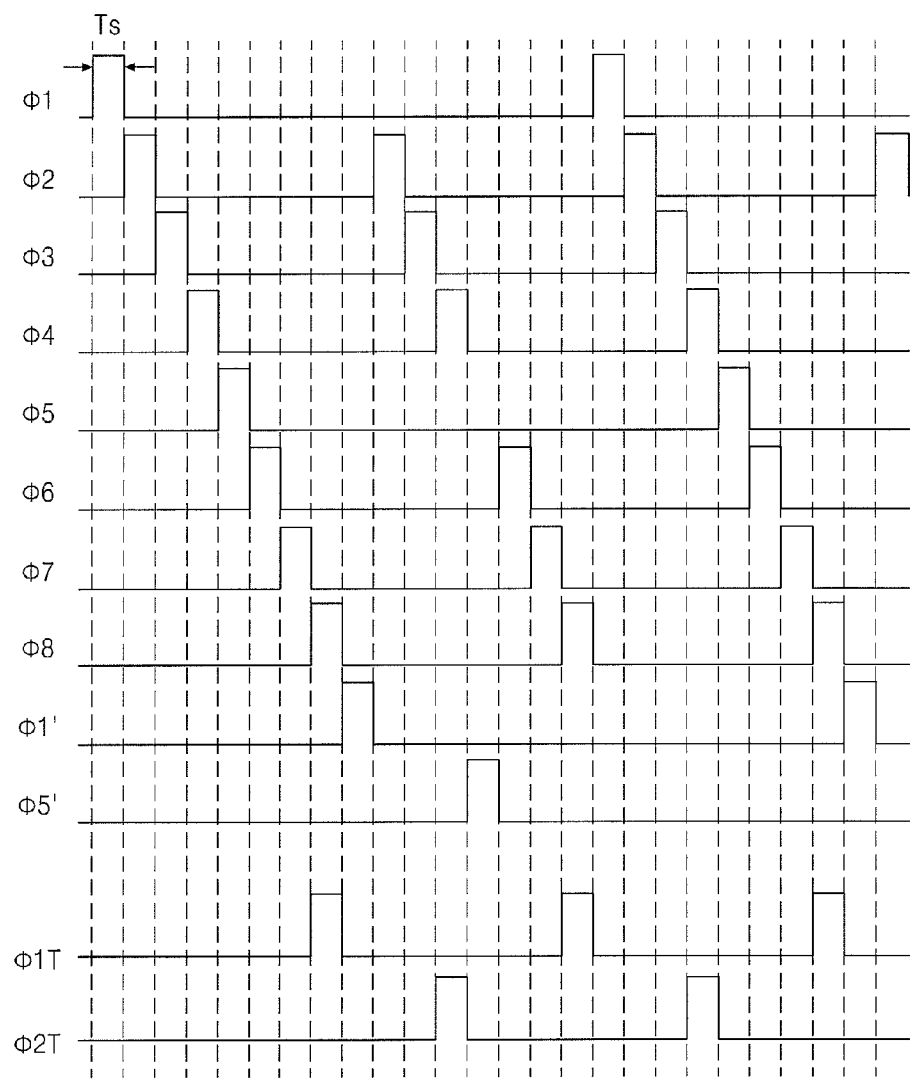
FIG. 3 is a timing diagram for explaining an exemplary embodiment of an operation of the discrete time filter of FIG. 2.

FIG. 2 is a circuit diagram illustrating an exemplary embodiment of a basic structure of a discrete time filter 200 according to aspects of the present inventive concept. FIG. 3 is a timing diagram for explaining an exemplary embodiment of an operation of the discrete time filter 200 of FIG. 2. The operation of the discrete time filter 200 is described below with reference to FIGS. 2 and 3.

Referring to the embodiment of FIG. 2, the discrete time filter 200 includes the transconductance circuit 101, a plurality of sampling cells SC1-SC8, a first dummy sampling cell SC1', a second dummy sampling cell SC5', a first capacitor C1, a second capacitor C2, and a buffer 110. Since the transconductance circuit 101 is already described above, a detailed description thereof will be omitted here.

Each of the sampling cells SC1-SC8 may perform a current mode sampling operation based on a current input to an input terminal IN in response to a corresponding one of a plurality of sampling clock signals $\Phi1$-$\Phi8$. Also, each of the sampling cells SC1-SC8 may be reset in response to the sampling clock signals $\Phi1$-$\Phi8$ and a corresponding one of the dummy sampling clock signals $\Phi1'$ and $\Phi5'$.

The first dummy sampling cell SC1' and the first sampling cell SC1 may alternately perform the current mode sampling operation based on the input current in response to a first dummy sampling clock signal $\Phi1'$, or be alternately reset in response to the sampling clock signal $\Phi8$. The first sampling cell SC1 may be reset by alternately responding to the sampling clock signal $\Phi8$ and the first dummy sampling clock signal $\Phi1'$.

The second dummy sampling cell SC5' and the fifth sampling cell SC5 may alternately perform the current mode sampling operation based on the input current in response to a second dummy sampling clock signal $\Phi5'$, or be alternately reset in response to the sampling clock signal $\Phi4$. The fifth sampling cell SC5 may be reset by alternately responding to the sampling clock signal $\Phi4$ and the second dummy sampling clock signal $\Phi5'$.

Each of the sampling cells SC1-SC8 includes at least one sub-sampling cell. In FIG. 2, each of the sampling cells SC1-SC8 includes four (4) sub-sampling cells, and each sub-sampling cell includes a sampling capacitor Cs and reset switch SWr connected in parallel. However, the present inventive concept is not limited to the arrangement shown in FIG. 2. Referring to the example of FIG. 6, each sub-sampling cell may include a sampling switch SWs, an output switch SWo, a sampling capacitor Cs, and a reset switch SWr. The operation of the sub-sampling cell is similar to that of the discrete time filter of FIG. 1.

Sampling switch SWs and the output switch SWo are serially connected between the input terminal IN and an output terminal OUT. The sampling switch SWs may be switched in response to a corresponding one of the sampling clock signals $\Phi1$-$\Phi8$. The output switch SWo may be switched in response to a corresponding one of output clock signals $\Phi1T$ and $\Phi2T$.

The sampling capacitor Cs is connected between a common node of the sampling switch SWs and the output switch SWo, and a ground voltage line. When the sampling switch SWs is disconnected, the sampling capacitor Cs accumulates the electric charges based on the current input to the input terminal IN. When the output switch SWo is disconnected, the sampling capacitor Cs outputs the accumulated electric charges to the output terminal OUT.

The reset switch SWr is connected between the common node of the sampling switch SWs and the output switch SWo, and the ground voltage line. The reset switch SWr may be switched in response to a corresponding one of the sampling clock signals $\Phi1$-$\Phi8$. In FIG. 2, the signals applied to the reset switch SWr are indicated as $\Phi1r$-$\Phi8r$. When the reset switch SWr is disconnected, the electric charges accumulated in the sampling capacitor Cs are discharged to the ground voltage line so that the sampling cell may be reset.

Each of the dummy sampling cells SC1' and SC2' has the same structure as that of a corresponding sampling cell and alternately performs a sampling operation and a reset operation with the corresponding sampling cell. Each of the dummy sampling cells SC1' and SC2' may include at least one sub-sampling cell having the same structure as that of the sub-sampling cell of the sampling cell.

However, the sampling switch of the sub-sampling cell of the dummy sampling cell is alternately switched with the sampling switch of the sub-sampling cell of the sampling cell at a sampling cycle in response to a corresponding one of dummy sampling clock signals $\Phi1'$ and $\Phi5'$. Also, the reset switch of the sub-sampling cell of the dummy sampling cell and the reset switch of the sub-sampling cell of the sampling cell corresponding to the dummy sampling cell are alternately switched at the sampling cycle.

The first capacitor C1 connected between the input terminal IN and the ground voltage line stabilizes the signal input to the input terminal IN. The second capacitor C2 connected between the output terminal OUT and the ground voltage line stabilizes the signal output to the output terminal OUT. The buffer 110 buffers the signal output to the output terminal OUT.

On the assumption that each of the sampling cells SC1-SC8 and the dummy sampling cells SC1' and SC2' of FIG. 2 includes a sub-sampling cell, the operation of the discrete time filter 200 of FIG. 2 is described based on the timing diagram of FIG. 3. The discrete time filter 200 simultaneously performs a first sampling operation starting at the first sampling cell SC1 and a second sampling operation starting at the fifth sampling cell SC5. Such a method is referred to as an interpolation method.

The first through eighth sampling cells SC1-SC8 sequentially perform the sampling operation, respectively, in response to the first through eighth sampling clock signals $\Phi1$-$\Phi8$. Sampling start points are the first sampling cell SC1 and the fifth sampling cell SC5.

When the first sampling process is completed, the first output clock signal $\Phi1T$ is activated and then the sampling cells SC1-SC8 simultaneously output sampled signals to the output terminal OUT. Also, when the second sampling process is completed, the second output clock signal $\Phi2T$ is activated and then the sampling cells SC1-SC8 simultaneously output sampled signals to the output terminal OUT. Such a method is referred to as a moving average method. When interpolation is not considered, the frequency of an input signal may be decimated by $\frac{1}{8}$ by the moving average method. However, considering the interpolation method, the frequency of an input signal is decimated by $\frac{1}{4}$. For example, when the frequency of the input signal of the discrete time filter 200 is 400 MHz, the frequency of the output signal of the discrete time filter 200 may be decimated to 100 MHz.

The discrete time filter 100 using the moving average method can be operated as a low pass filter having a spectrum characteristic in a sinc function form. The sampling operation of the discrete time filter 100 is referred to as a windowed integration sampler (hereinafter, referred to as "WIS") operation.

When the sampling cells SC1-SC8 output the sampling signals, the sampling cells SC1-SC8 are reset to perform the sampling operation at the next sampling cycle. The third and fourth sampling cells SC3 and SC4 and the seventh and eighth sampling cells SC7 and SC8 are respectively reset in response to the sampling clock signal of a previous sampling cell. For example, the third sampling cell SC3 is reset in response to the second sampling clock signal $\Phi 2$, and the fourth sampling cell SC4 is reset in response to the third sampling clock signal $\Phi 3$.

However, the first sampling cell SC1 is not reset in response to the eighth sampling clock signal $\Phi 8$ of the eighth sampling cell SC8 that is the previous sampling cell. The first dummy sampling cell SC1' is reset in response to the eighth sampling clock signal $\Phi 8$. This is to prevent the distortion of the sampling signal of the first sampling cell SC1 output in response to the first output clock signal $\Phi 1T$ having the same phase as that of the eighth sampling clock signal $\Phi 8$.

Then, the first dummy sampling cell SC1' performs the sampling operation at the next sampling cycle so that the first sampling cell SC1 may be reset in response to the eighth sampling clock signal $\Phi 8$. As described above, the first sampling cell SC1 and the first dummy sampling cell SC1' alternately perform the sampling operation and the reset operation at each sampling cycle.

The operation of the fifth sampling cell SC5 and the second dummy sampling cell SC5' are the same as those of the above-described eighth sampling cell SC8 and the first dummy sampling cell SC1'. That is, the second dummy sampling cell SC5', not the fifth sampling cell SC5, is reset in response to the fourth sampling clock signal $\Phi 4$ of the fourth sampling cell SC4 that is the previous sampling cell. This is to prevent the distortion of the sampling signal of the fifth sampling cell SC5 output in response to the second output clock signal $\Phi 2T$ having the same phase as that of the fourth sampling clock signal $\Phi 4$.

Then, the second dummy sampling cell SC5' performs the sampling operation at the next sampling cycle so that the fifth sampling cell SC5 may be reset in response to the fourth sampling clock signal $\Phi 4$. As described above, the fifth sampling cell SC5 and the second dummy sampling cell SC5' alternately perform the sampling operation and the reset operation at each sampling cycle.

Since the first sampling cell SC1 and the first dummy sampling cell SC1' alternately perform the sampling operation at each sampling cycle and the fifth sampling cell SC5 and the second dummy sampling cell SC2' perform the sampling operation in the same manner, the cycle of each of the first sampling clock signal $\Phi 1$, the first dummy sampling clock signal $\Phi 1'$, the fifth sampling clock signal $\Phi 5$, and the second dummy sampling clock signal $\Phi 5'$ is twice the cycle of each of the other sampling clock signals.

The second sampling cell SC2 is alternately reset at each sampling cycle in response to the first sampling clock signal $\Phi 1$ and the first dummy sampling clock signal $\Phi 1'$. The sixth sampling cell SC6 is alternately reset at each sampling cycle in response to the fifth sampling clock signal $\Phi 5$ and the second dummy sampling clock signal $\Phi 5'$.

As illustrated in FIG. 3, the discrete time filter 200 uses the whole sampling cycle for signal sampling in response to the sampling clock signals $\Phi 1$-$\Phi 8$ and the dummy sampling clock signals $\Phi 1'$ and $\Phi 5'$. However, in a conventional discrete time filter, half of the sampling section Ts of each sampling cell of the discrete time filter would be used for signal sampling, while the other half thereof would be used to reset the sampling cell.

Thus, the discrete time filter 200 of the present exemplary embodiment has a superior settling characteristic for a sampling signal, when compared to the conventional discrete time filter, which is achieved by increasing the sampling section. To increase the settling characteristic of a sampling signal of the conventional discrete time filter, the size of the switches of a sampling cell or power consumption would need to be increased. In contrast, the discrete time filter 200 according to aspects of the present inventive concept may have the same performance with a smaller size and less power consumption than the conventional discrete time filter.

Also, a gain of the discrete time filter 200 of the present exemplary embodiment may be higher than that of the conventional discrete time filter because the gain of the discrete time filter 200 is proportional to the short-circuit time of the sampling switch SWs. The discrete time filter 200 may be operated by a weighted moving average method in which a weight is given to the sampling cells SC1-SC8, in the exemplary embodiment. This means that the number of the sub-sampling cells of the sampling cells SC1-SC8 operated during the sampling process may be set to be different from each other.

In FIG. 2, the sub-sampling cells indicated by a thick line are operated in the first sampling process, whereas the other sampling cells are operated in the second sampling process. Referring to FIG. 2, it can be seen that the number of the sub-sampling cells operated in the first sampling process changes in order of 1, 2, 3, 4 . . . from the first sampling cell SC1, and that the number of the sub-sampling cells operated in the second sampling process changes in order of . . . 3, 2, 1, 0 from the fifth sampling cell SC5.

Although the spectrum characteristic of a filter based on the general moving average method indicates a sinc function form, the spectrum characteristic of the discrete time filter 200 based on the weighted moving average method indicates the square form of a sinc function. This means that the discrete time filter 200 according to the present exemplary embodiment may have a frequency filtering characteristic that is sharper than conventional discrete time filters.

Figure 4A:
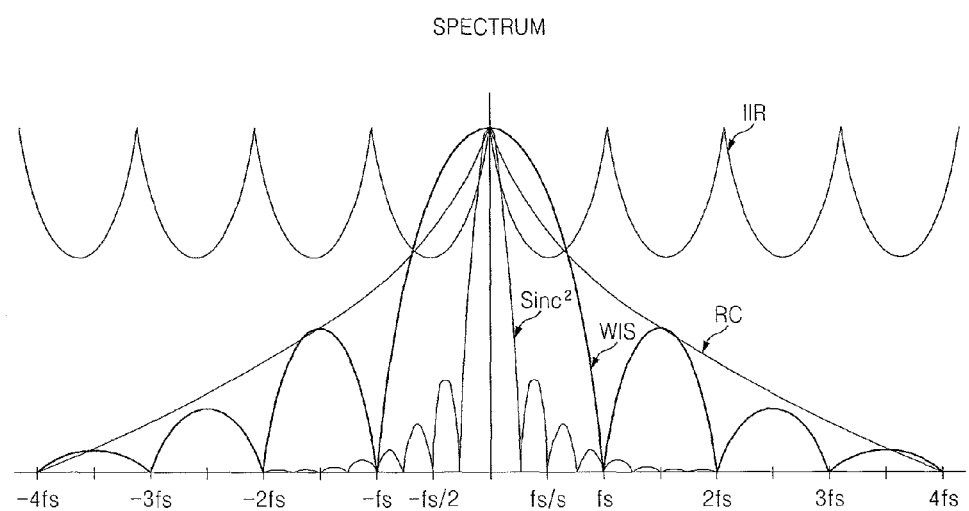
FIG. 4A is a graph showing an exemplary embodiment of spectrum characteristics of the respective portions of the discrete time filter of FIG. 2.

FIG. 4A is a graph showing the spectrum characteristics of the respective portions of the discrete time filter 200 of FIG. 2. FIG. 4A illustrates a spectrum WIS according to the current mode sampling operation, that is, the WIS operation, of the discrete time filter 200 that is described with reference to FIG. 2, a spectrum resistor-capacitor (RC) by an RC filter according to the output resistance of the separate RC filter and/or the transconductance circuit 101 and the capacitance of the first capacitor C1, a spectrum $Sinc^2$ in the square form of a sinc function according to the weighted moving average operation, and a spectrum infinite impulse response (IIR) according to an IIR filter characteristic by the first capacitor C1 having a characteristic of storing the previous state. Although it is not illustrated in FIG. 4A, the spectrum $Sinc^2$ in the square form of a sinc function is regularly repeated at each sampling frequency fs.

Figure 4B:
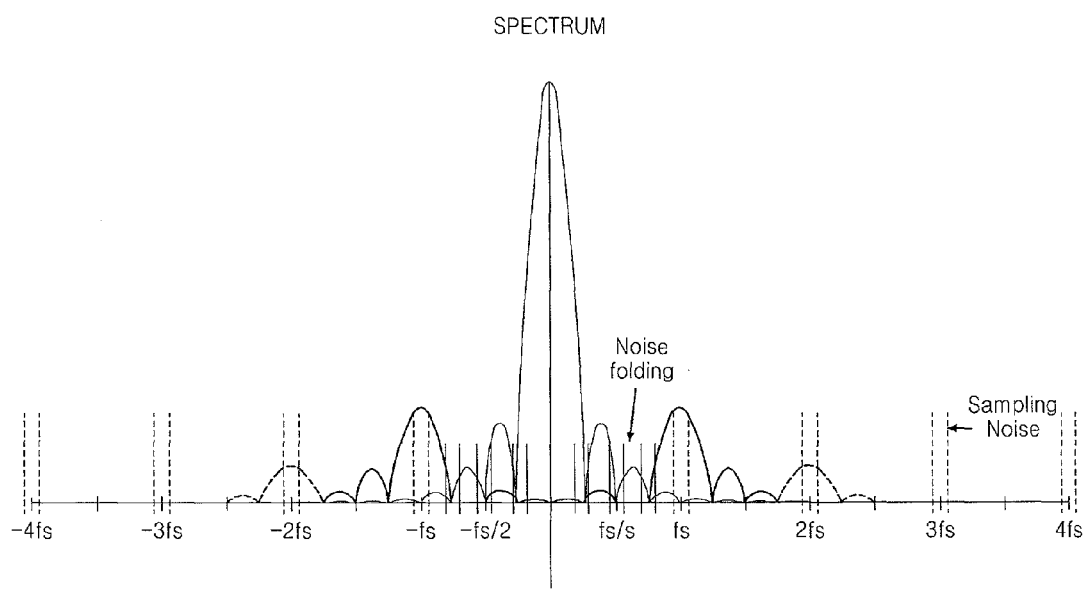
FIG. 4B is a graph showing an exemplary embodiment of a spectrum characteristic obtained by combining the respective portions of the discrete time filter of FIG. 4A.

FIG. 4B is a graph showing a spectrum characteristic obtained by combining the respective portions of the discrete time filter 200 of FIG. 4A. Referring to FIG. 4B, regular sampling noise is generated in units of sampling frequencies (fs) and a spectrum in the square form of a sinc function is repeated. Accordingly, it can be seen that noise folding by decimation is generated.

FIG. 4C is a graph showing the spectrum characteristic of the discrete time filter 200 in consideration of a frequency decimation in the spectrum characteristic of FIG. 4B. Referring to FIG. 4C, a desired channel signal may be obtained by filtering the signal sampled by the discrete time filter 200 by using an in-band digital filter. FIG. 4C does not illustrate noise due to noise folding.

The discrete time filter 200 performs interpolation corresponding to a decimation factor of the frequency decimation operation. This is to reduce the noise due to noise folding. The noise folding reduction by the sampling that occurs according to the interpolation method is discussed with reference to FIGS. 5A and 5B.

Figure 5B:
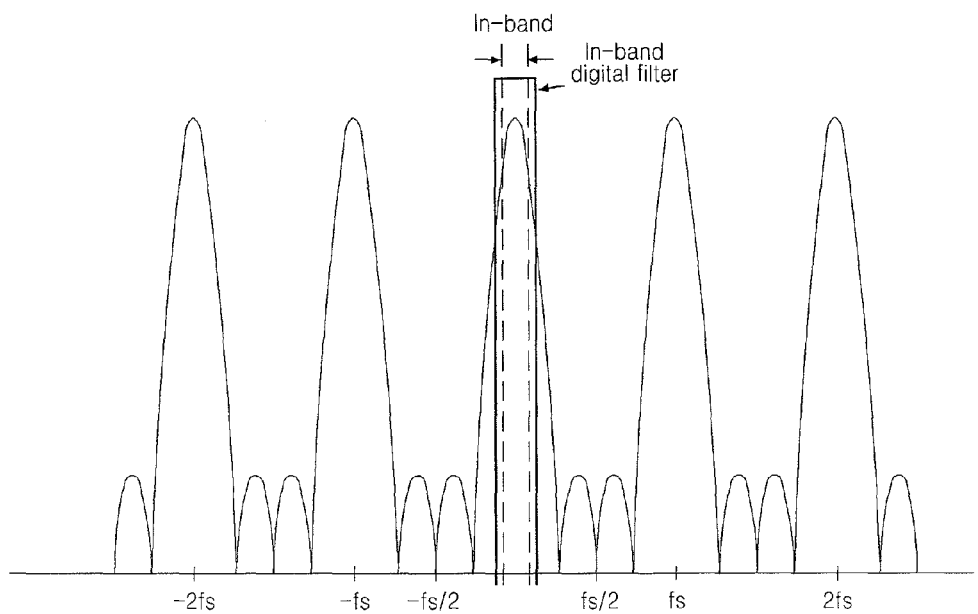
FIG. 5B is a graph showing an exemplary embodiment of a spectrum characteristic of the discrete time filter according to the timing diagram of FIG. 5A.

FIG. 5A is a timing diagram for explaining a process in which the discrete time filter 200 having four (4) sampling cells, according to an exemplary embodiment of the present inventive concept, performs an interpolation operation, but not frequency decimation. FIG. 5B is a graph showing the spectrum characteristic of the discrete time filter 200 according to the timing diagram of FIG. 5A. The timing diagram of FIG. 5A is based on the assumption that, in the discrete time filter 200 of FIG. 2, only the first through fourth sampling cells SC1-SC4 simply perform a moving average operation in response to the first through fourth sampling clock signals Φ1-Φ4.

As the discrete time filter 200 performs a 4-tap moving average operation, the frequency is decimated by ¼. However, the discrete time filter 200 performs interpolation by four (4) decimation factors in response to the first through fourth output clock signals Φ1T-Φ4T. Thus, the spectrum of the discrete time filter 200 has a form that repeats the spectrum before the decimation at each sampling frequency fs, thereby reducing the in-band noise folding. As a result, a desired channel signal may be obtained by filtering the signal sampled by the discrete time filter 200 using the in-band digital filter.

Figure 6:
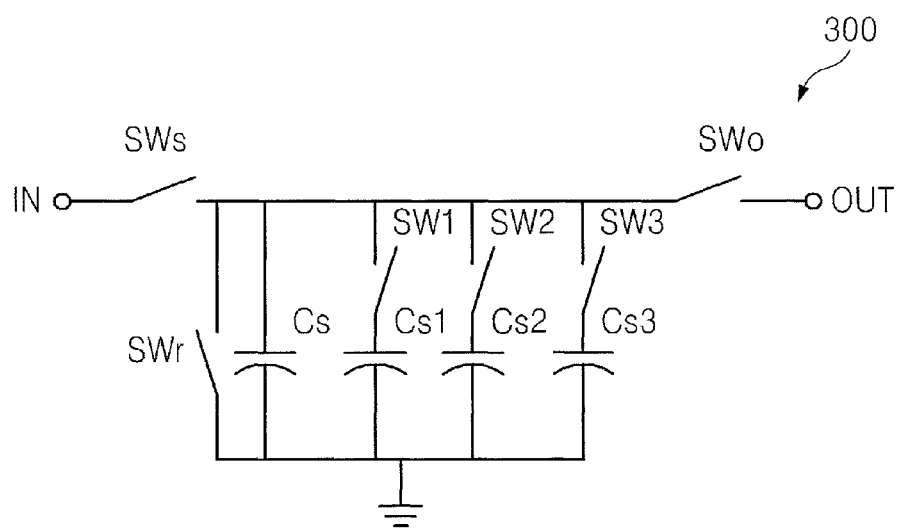
FIG. 6 is a circuit diagram illustrating an exemplary embodiment of a sub-sampling cell of a sampling cell of a discrete time filter according to aspects of the present inventive concept.

FIG. 6 is a circuit diagram illustrating an exemplary embodiment of a sub-sampling cell 300 of the discrete time filter 200 according to an aspect of the present inventive concept. In FIG. 6, a sampling cell controls a gain of the discrete time filter 200 by controlling the capacity of a capacitor used for sampling, based on a relationship where the gain of the discrete time filter 200 is inversely proportional to the capacity of the capacitor used for sampling.

Referring to FIG. 6, the sub-sampling cell 300 includes the sampling switch SWs, the reset switch SWr, the output switch SWo, capacitor Cs, and a plurality of switch and capacitor pairs SW1 and Cs1, SW2 and Cs2, . . . , SW3 and Cs3 that are serially connected between a common node of the sampling switch SWs and the output switch SWo, and the ground voltage line.

Since the sampling switch SWs, the reset switch SWr, the output switch SWo, and the capacitor Cs of the sub-sampling cell 300 are already described above, detailed descriptions thereof will be omitted herein. The capacity of the capacitor used for sampling may be controlled by the switching operation of the switches that are switched in response to a corresponding one of a plurality of gain control signals (not shown). Thus, the gain of the discrete time filter 200 may be controlled by the sub-sampling cell 300.

Figure 7:
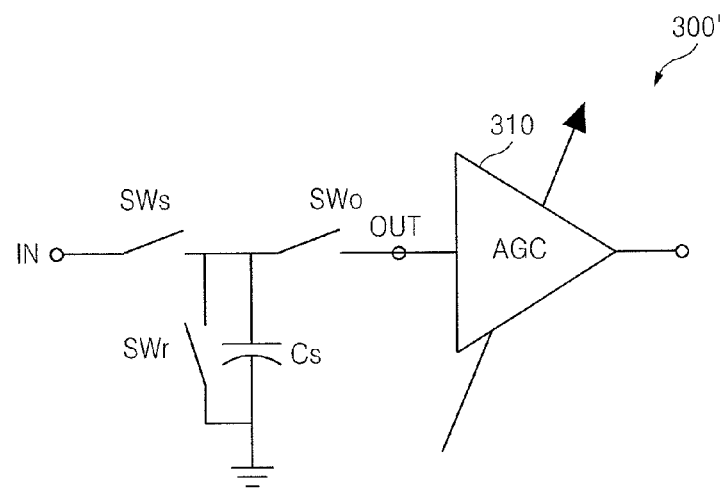
FIG. 7 is a circuit diagram illustrating an exemplary embodiment of a sub-sampling cell of a sampling cell of a discrete time filter according to another aspect of the present inventive concept.

FIG. 7 is a circuit diagram illustrating another exemplary embodiment of a sub-sampling cell 300' of the discrete time filter 200, according to another aspect the present inventive concept. Referring to FIG. 7, the sub-sampling cell 300' separately includes an automatic gain control (AGC) block 310, in addition to the sampling switch SWs, the reset switch SWr, the output switch SWo and capacitor Cs. The automatic gain control block 310 is connected to the output terminal OUT of the discrete time filter 200 and may control the gain of the discrete time filter 200.

Figure 8:
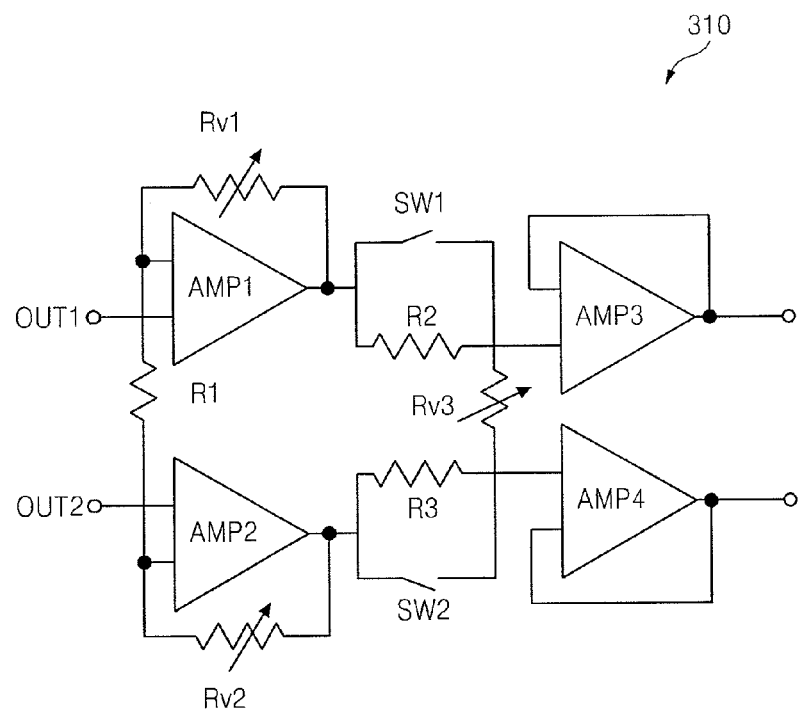
FIG. 8 is a circuit diagram illustrating an exemplary embodiment of the automatic gain control block of FIG. 7.

FIG. 8 is a circuit diagram of an exemplary embodiment of the automatic gain control block 310 of FIG. 7. Referring to FIG. 8, the automatic gain control block 310 may be implemented by a plurality of resistors R1, R2, and R3, a plurality of variable resistors Rv1-Rv3, and a plurality of amplifiers AMP1-AMP4, which are connected to the output terminals OUT1 and OUT2 of the discrete time filter 200. However, the present inventive concept is not limited thereto. Since the structure and operation of the automatic gain control block 310 are well known to one skilled in the art to which the present inventive concept pertains, a detailed description thereof will be omitted herein.

Figure 9:
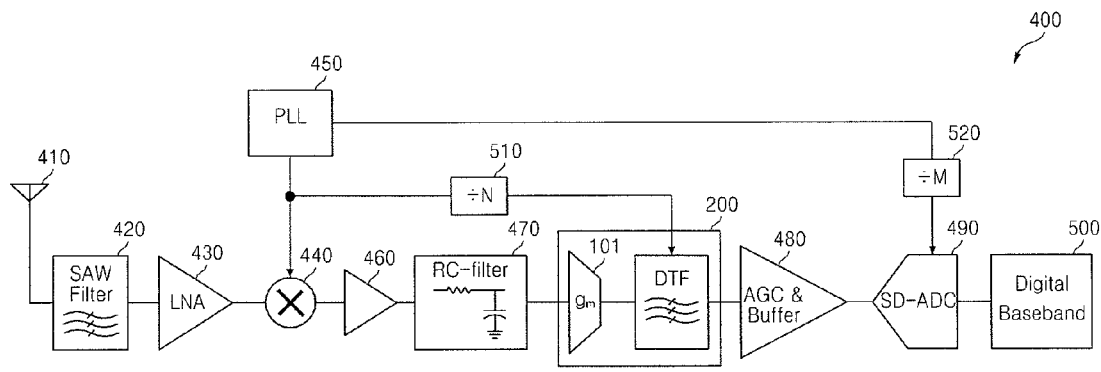
FIG. 9 is a block diagram of an exemplary embodiment of a receiver according to aspects of the present inventive concept.

FIG. 9 is a block diagram of an exemplary embodiment of a receiver 400 according to an aspect of the present inventive concept. Referring to FIG. 9, the receiver 400 includes an antenna 410, a surface acoustic wave (SAW) filter 420, a low noise amplifier (LNA) 430, a mixer 440, a phase locked loop (PLL) 450, a first amplifier 460, a resistor-capacitor (RC) filter 470, the discrete time filter (DTF) 200, an automatic gain control (AGC) and buffer block 480, a sigma-delta analog-digital converter (SD-ADC) 490, a digital baseband block 500, and dividers 510 and 520.

The receiver 400 includes the discrete time filter 200 implemented by a digital circuit. Since the discrete time filter 200 is already described above, a detailed description thereof will be omitted herein. At least one of the PLL 450, the SD-ADC 490, and the digital baseband block 500 included in the receiver 400 may be implemented by a digital circuit. Thus, the receiver 400 may simultaneously have merits of a general digital circuit, for example, insensitivity to noise, reduction in time and costs for design/development, and reduction in size and power consumption, and the merits of the discrete time filter 200 according to the present exemplary embodiment.

Figure 10:
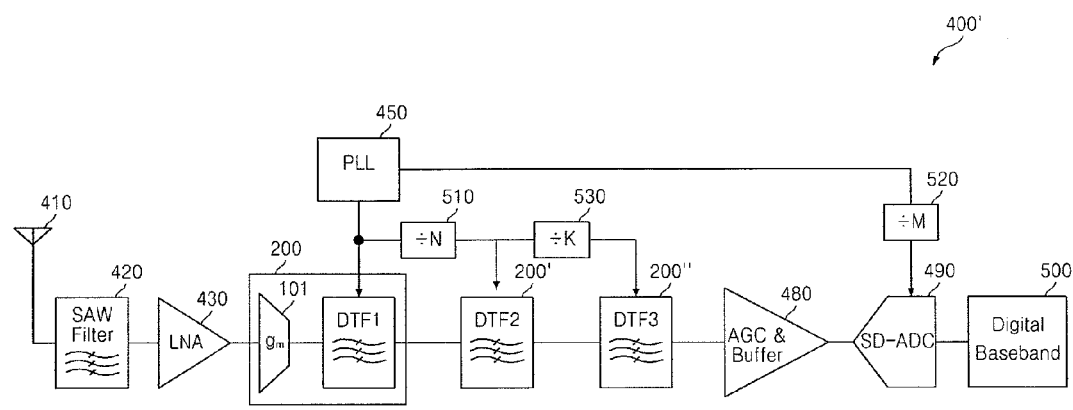
FIG. 10 is a block diagram of an exemplary embodiment of a receiver according to another aspect of the present inventive concept.

FIG. 10 is a block diagram of an exemplary embodiment of a receiver 400' according to another aspect of the present inventive concept. The receiver 400' of FIG. 10 has the following differences from the receiver 400 of FIG. 9. The receiver 400' of FIG. 10 includes a plurality of discrete time filters 200, 200', and 200" to perform a function corresponding to the mixer 440 of FIG. 9, that is, to convert an RF band signal to a baseband signal. The receiver 400' may further include a divider 530 corresponding to the discrete time filters 200, 200', and 200"

At least one of the PLL 450, the SD-ADC 490, and the digital baseband block 500 included in the receiver 400' may be implemented by a digital circuit. Thus, the receiver 400' of FIG. 10 may have the same merits as those of the receiver 400 of FIG. 9.

The discrete time filter 200 and/or the receiver 400 or 400' according to some embodiments of the present inventive concept may be packed in various types of packages. As examples, the various packages may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

The present inventive concept can be embodied in hardware, software, firmware or a combination thereof. When the method is embodied in software, it can be embodied as computer readable codes or programs on a computer readable recording medium. The computer readable recording medium can be any non-transitory data storage device that can store data which can be thereafter read by a computer system. Examples of the computer readable recording medium may include read-only memory (ROM), random-access memory (RAM), electrically erasable programmable ROM (EEPROM), and flash memory.

As described above, in the discrete time filter and the receiver according to the present inventive concept, 1) jitter and flicker noise characteristics may be superior because the current mode sampling operation is performed, 2) stability in a high speed operation may be superior due to the increased sampling time, 3) an implemented size may be decreased because the filter stage and the gain control stage are separated, and 4) folding noise due to the sampling and frequency decimation may be reduced because interpolation sampling is performed.

While the inventive concept has been particularly shown and described with reference to exemplary embodiments thereof, it will be understood that various changes in form and details may be made therein without departing from the spirit and scope of the following claims. It is intended by the following claims to claim that which is literally described and all equivalents thereto, including all modifications and variations that fall within the scope of each claim.

What is claimed is:

1. A discrete time filter comprising:
a plurality of sampling cells responsive to a plurality of sampling clock signals, wherein a first sampling cell is arranged to perform a current mode sampling operation based on current input to an input terminal and in response to a corresponding first sampling clock signal, and to be reset in response to the first sampling clock signal and a first dummy sampling clock signal;
a first dummy sampling cell arranged to alternately perform the current mode sampling operation based on current input to the input terminal with the first sampling cell and in response to the first dummy sampling clock signal, and to be reset alternately with the first sampling cell in response to the first sampling clock signal; and
an output terminal configured to output sampled signals from the plurality of sampling cells in response to an output clock signal.

2. The discrete time filter of claim 1, arranged to perform a frequency decimation operation and an interpolation operation corresponding to a decimation factor of the frequency decimation operation.

3. The discrete time filter of claim 1, wherein the first sampling cell is reset by alternately responding to the first sampling clock signal and the first dummy sampling clock signal.

4. The discrete time filter of claim 3, further comprising a capacitor connected between the input terminal and a ground voltage line.

5. The discrete time filter of claim 1, further comprising an automatic gain control block connected to the output terminal of the discrete time filter and arranged to control a gain of the discrete time filter.

6. The discrete time filter of claim 1, wherein each of the plurality of sampling cells comprises:
a pair of first switches serially connected between the input terminal and the output terminal of the discrete time filter, each of the first switches arranged to be switched in response to a corresponding one of the plurality of sampling clock signals and the output clock signal, respectively;
a capacitor connected between a common node of the pair of first switches and a ground voltage line; and
at least one first sub-sampling cell comprising a first sub-sampling cell switch connected between the common node of the pair of first switches and the ground voltage line and arranged to be switched in response to a corresponding one of the plurality of sampling clock signals.

7. The discrete time filter of claim 6, wherein the at least one of the first sub-sampling cell further comprises a plurality of pairs including a switch and a capacitor, each pair being serially connected between the common node of the pair of first switches and the ground voltage line, and
wherein the switch is switched in response to a corresponding one of a plurality of gain control signals.

8. The discrete time filter of claim 6, wherein the first dummy sampling cell comprises:
a pair of second switches serially connected between the input terminal and the output terminal, each of the second switches arranged to be switched in response to the first sampling clock signal and the output clock signal, respectively;
a capacitor connected between a common node of the pair of second switches and the ground voltage line; and
at least one second sub-sampling cell comprising a second sub-sampling cell switch connected between the common node of the pair of second switches and the ground voltage line and arranged to be alternately switched with the first sub-sampling cell switch in response to the first sampling clock signal.

9. The discrete time filter of claim 1, further comprising:
a second dummy sampling cell arranged to alternately perform the current mode sampling operation based on the current input to the input terminal with a second sampling cell and in response to a second dummy sampling clock signal, and to be reset alternately with the second sampling cell in response to a corresponding second sampling clock signal,
wherein the second sampling cell is arranged to be reset by alternately responding to the corresponding second sampling clock signal and the second dummy sampling clock signal.

10. A receiver comprising:
a mixer arranged to receive a radio frequency (RF) signal and to convert a received RF signal to a baseband signal based on a signal output by a delay lock loop and to output a converted signal; and
a discrete time filter defined arranged to perform a current mode sampling operation to the baseband signal output by the mixer, the discrete time filter comprising:
a plurality of sampling cells responsive to a plurality of sampling clock signals, wherein a first sampling cell is arranged to perform a current mode sampling operation based on current input to an input terminal and in response to a corresponding first sampling clock signal, and to be reset in response to the first sampling clock signal and a first dummy sampling clock signal; and
a first dummy sampling cell arranged to alternately perform the current mode sampling operation based on current input to the input terminal with the first sampling cell and in response to the first dummy sampling clock signal, and to be reset alternately with the first sampling cell in response to the first sampling clock signal; and an output terminal configured to output sampled signals from the plurality of sampling cells in response to an output clock signal.

11. The receiver of claim 10, wherein each of the plurality of sampling cells comprises:
   a pair of first switches serially connected between the input terminal and the output terminal of the discrete time filter, each of the first switches arranged to be switched in response to a corresponding one of the plurality of sampling clock signals and the output clock signal, respectively;
   a capacitor connected between a common node of the pair of first switches and a ground voltage line; and
   at least one first sub-sampling cell comprising a first sub-sampling cell switch connected between the common node of the pair of first switches and the ground voltage line and arranged to be switched in response to a corresponding one of the plurality of sampling clock signals.

12. The receiver claim 11, wherein the at least one of the first sub-sampling cell further comprises a plurality of pairs including a switch and a capacitor, each pair being serially connected between the common node of the pair of first switches and the ground voltage line, and
   wherein the switch is switched in response to a corresponding one of a plurality of gain control signals.

13. The receiver of claim 11, wherein the first dummy sampling cell comprises:
   a pair of second switches serially connected between the input terminal and the output terminal, each of the second switches arranged to be switched in response to the first sampling clock signal and the output clock signal, respectively;
   a capacitor connected between a common node of the pair of second switches and the ground voltage line; and
   at least one second sub-sampling cell comprising a second sub-sampling cell switch connected between the common node of the pair of second switches and the ground voltage line and arranged to be alternately switched with the first sub-sampling cell switch in response to the first sampling clock signal.

14. The receiver of claim 10, wherein the discrete time filter further comprises:
   a second dummy sampling cell arranged to alternately perform the current mode sampling operation based on the current input to the input terminal with a second sampling cell and in response to a second dummy sampling clock signal, and to be reset alternately with the second sampling cell in response to a corresponding second sampling clock signal,
   wherein the second sampling cell is arranged to be reset by alternately responding to the corresponding second sampling clock signal and the second dummy sampling clock signal.

15. A receiver comprising:
   a mixer arranged to receive a radio frequency (RF) signal, and comprising a first discrete time filter arranged to convert the received RF signal to a baseband signal by performing a first current mode sampling operation on the received RF signal based on a signal output by a delay lock loop, where the mixer outputs a converted signal; and
   a second discrete time filter arranged to perform a second current mode sampling operation to the baseband signal output by the mixer,
   wherein the first and second discrete time filters each comprise:
      a plurality of sampling cells responsive to a plurality of sampling clock signals, wherein a first sampling cell is arranged to perform a current mode sampling operation based on current input to an input terminal and in response to a corresponding first sampling clock signal, and to be reset in response to the first sampling clock signal and a first dummy sampling clock signal; and
      a first dummy sampling cell arranged to alternately perform the current mode sampling operation based on current input to the input terminal with the first sampling cell and in response to the first dummy sampling clock signal, and to be reset alternately with the first sampling cell in response to the first sampling clock signal; and
      an output terminal configured to output sampled signals from the plurality of sampling cells in response to an output clock signal.

16. The receiver of claim 15, wherein the first and second discrete time filters have a similar structure.

17. The receiver of claim 15, wherein each of the plurality of sampling cells in the first and second discrete time filters comprises:
   a pair of first switches serially connected between the input terminal and the output terminal of the respective first or second discrete time filter, each of the first switches arranged to be switched in response to a corresponding one of the plurality of sampling clock signals and the output clock signal, respectively;
   a capacitor connected between a common node of the pair of first switches and a ground voltage line; and
   at least one first sub-sampling cell comprising a first sub-sampling cell switch connected between the common node of the pair of first switches and the ground voltage line and arranged to be switched in response to a corresponding one of the plurality of sampling clock signals.

18. The receiver claim 17, wherein the at least one of the first sub-sampling cell of each filter further comprises a plurality of pairs including a switch and a capacitor, each pair being serially connected between the common node of the pair of first switches and the ground voltage line, and
   wherein the switch is switched in response to a corresponding one of a plurality of gain control signals.

19. The receiver of claim 17, wherein each first dummy sampling cell comprises:
   a pair of second switches serially connected between the input terminal and the output terminal, each of the second switches arranged to be switched in response to the first sampling clock signal and the output clock signal, respectively;
   a capacitor connected between a common node of the pair of second switches and the ground voltage line; and
   at least one second sub-sampling cell comprising a second sub-sampling cell switch connected between the common node of the pair of second switches and the ground voltage line and arranged to be alternately switched with the first sub-sampling cell switch in response to the first sampling clock signal.

20. The receiver of claim 15, wherein the first and second discrete time filters each further comprises:

a second dummy sampling cell arranged to alternately perform the current mode sampling operation based on the current input to the input terminal with a second sampling cell and in response to a second dummy sampling clock signal, and to be reset alternately with the second sampling cell in response to a corresponding second sampling clock signal, wherein the second sampling cell is arranged to be reset by alternately responding to the corresponding second sampling clock signal and the second dummy sampling clock signal.

* * * * *